(12) United States Patent
D'Evelyn et al.

(10) Patent No.: US 7,368,015 B2
(45) Date of Patent: May 6, 2008

(54) APPARATUS FOR PRODUCING SINGLE CRYSTAL AND QUASI-SINGLE CRYSTAL, AND ASSOCIATED METHOD

(75) Inventors: Mark Philip D'Evelyn, Niskayuna, NY (US); Dong-Sil Park, Niskayuna, NY (US); Victor Lienkong Lou, Niskayuna, NY (US); Thomas Francis McNulty, Ballston Lake, NY (US); Huicong Hong, Niskayuna, NY (US)

(73) Assignee: Momentive Performance Materials Inc., Wilton, CT (US)

( * ) Notice: Subject to any disclaimer, the term of this patent is extended or adjusted under 35 U.S.C. 154(b) by 247 days.

(21) Appl. No.: 11/249,896

(22) Filed: Oct. 13, 2005

(65) Prior Publication Data
US 2006/0048699 A1 Mar. 9, 2006

Related U.S. Application Data

(63) Continuation-in-part of application No. 10/063,164, filed on Mar. 27, 2002, now Pat. No. 7,063,741.

(51) Int. Cl.
*G30B 35/00* (2006.01)
(52) U.S. Cl. .......................... 117/224; 117/81; 117/83; 117/213
(58) Field of Classification Search ................ 117/73, 117/74, 76, 78, 81, 213, 952, 83, 224
See application file for complete search history.

(56) References Cited

U.S. PATENT DOCUMENTS 1,879,278 A 9/1932 Jacobs
1,986,196 A 1/1935 Grosse
2,544,414 A 3/1951 Bridgman et al.

(Continued)

FOREIGN PATENT DOCUMENTS

DE 44 13 423 10/1995

(Continued)

OTHER PUBLICATIONS

K. Byrappa and Masahiro Yoshimura, "*Apparatus*", Handbook of Hydrothermal Technology, pp. 82-160, 2001.

(Continued)

*Primary Examiner*—Felisa Hiteshew
(74) *Attorney, Agent, or Firm*—Dominick G. Vicari

(57) ABSTRACT

An apparatus including a crucible, an energy source, and a controller is provided. The crucible may be sealed to a nitrogen-containing gas, and may be chemically inert to at least ammonia at a temperature in a range of about 400 degrees Celsius to about 2500 degrees Celsius. The energy source may supply thermal energy to the crucible. The controller may control the energy source to selectively direct sufficient thermal energy to a predefined first volume within the crucible to attain and maintain a temperature in the first volume to be in a range of from about 400 degrees Celsius to about 2500 degrees Celsius. The thermal energy may be sufficient to initiate, sustain, or both initiate and sustain growth of a crystal in the first volume. The first temperature in the first volume may be controllable separately from a second temperature in another volume within the crucible. The first temperature and the second temperature differ from each other. Associated methods are provided.

33 Claims, 4 Drawing Sheets

U.S. PATENT DOCUMENTS

| | | | |
|---|---|---|---|
| 2,745,713 A | 5/1956 | Suits | |
| 2,785,058 A | 3/1957 | Buehler | |
| 2,895,812 A | 7/1959 | Kohman | 117/72 |
| 2,941,241 A | 6/1960 | Strong | |
| 2,947,609 A | 8/1960 | Strong | |
| 2,947,610 A | 8/1960 | Hall et al. | |
| 3,013,867 A | 12/1961 | Sawyer | 117/72 |
| 3,030,662 A | 4/1962 | Strong | |
| 3,088,170 A | 5/1963 | Strong | |
| 3,101,259 A | 8/1963 | Sawyer | 117/69 |
| 3,107,395 A | 10/1963 | Bundy | |
| 3,313,004 A | 4/1967 | Vahldiek et al. | |
| 3,473,935 A | 10/1969 | Wilson et al. | |
| 3,567,364 A | 3/1971 | Flanigen et al. | |
| 3,607,014 A | 9/1971 | Huml et al. | |
| 3,650,823 A | 3/1972 | Mead et al. | 438/22 |
| 3,913,212 A | 10/1975 | Bachmann et al. | |
| 3,933,573 A | 1/1976 | Dugger | |
| 4,055,982 A | 11/1977 | Ter-Minassian et al. | |
| 4,202,930 A | 5/1980 | Kokta et al. | |
| 4,430,051 A | 2/1984 | von Platen | |
| 4,523,478 A | 6/1985 | Zacharias, Jr. | |
| 4,685,995 A | 8/1987 | Hirano | |
| 4,699,084 A | 10/1987 | Wilson et al. | |
| 4,762,823 A | 8/1988 | Watanabe et al. | |
| 4,891,165 A | 1/1990 | Suthanthiran | |
| 4,910,403 A | 3/1990 | Kilham et al. | |
| 4,961,823 A | 10/1990 | Hirano et al. | |
| 5,236,674 A | 8/1993 | Frushour | |
| 5,868,837 A | 2/1999 | DiSalvo et al. | |
| 5,902,396 A | 5/1999 | Purdy | |
| 5,911,824 A | 6/1999 | Hammond et al. | |
| 5,942,148 A | 8/1999 | Preston | |
| 5,993,545 A | 11/1999 | Lupton et al. | |
| 6,113,985 A | 9/2000 | Suscavage et al. | |
| 6,177,057 B1 | 1/2001 | Purdy | |
| 6,270,569 B1 | 8/2001 | Shibata et al. | |
| 6,273,948 B1 | 8/2001 | Porowski et al. | |
| 6,285,010 B1 | 9/2001 | Fujikawa et al. | |
| 6,375,446 B1 | 4/2002 | Leonelli, Jr. | |
| 6,398,867 B1 | 6/2002 | D'Evelyn et al. | |
| 6,406,540 B1 | 6/2002 | Harris et al. | |
| 6,592,663 B1 | 7/2003 | Sarayama et al. | |
| 6,676,752 B1 | 1/2004 | Suscavage et al. | |
| 6,692,568 B2 | 2/2004 | Cuomo et al. | |
| 6,848,458 B1 | 2/2005 | Shrinivasan et al. | |
| 6,861,130 B2 | 3/2005 | D'Evelyn et al. | |
| 2002/0122757 A1 | 9/2002 | Chung et al. | |
| 2003/0041602 A1 | 3/2003 | Williams, III et al. | |
| 2003/0066800 A1 | 4/2003 | Saim et al. | |
| 2003/0127337 A1 | 7/2003 | Hanson et al. | 205/96 |
| 2003/0140845 A1 | 7/2003 | D'Evelyn | |
| 2003/0141301 A1 | 7/2003 | D'Evelyn et al. | |
| 2003/0164138 A1 | 9/2003 | Sarayama et al. | |
| 2003/0183155 A1 | 10/2003 | D'Evelyn et al. | 117/68 |
| 2003/0209191 A1 | 11/2003 | Purdy | |
| 2004/0003495 A1 | 1/2004 | Xu | |
| 2004/0134415 A1 | 7/2004 | D'Evelyn et al. | |
| 2005/0103257 A1 | 5/2005 | Xu et al. | |

FOREIGN PATENT DOCUMENTS

| | | |
|---|---|---|
| EP | 0 152 726 | 8/1985 |
| EP | 0 157 393 | 10/1985 |
| EP | 0 220 462 | 5/1987 |
| EP | 0 860 182 | 8/1998 |
| FR | 1 275 127 | 11/1961 |
| FR | 1 306 951 | 10/1962 |
| FR | 2 796 657 | 1/2001 |
| GB | 9 226 19 | 4/1963 |
| GB | 2 333 521 | 7/1999 |
| JP | 60091062 | 5/1985 |
| JP | 60122797 | 7/1985 |
| JP | 09206582 | 8/1997 |
| JP | 10005572 | 1/1998 |
| JP | 11060394 | 3/1999 |
| JP | 2001058900 | 3/2001 |
| JP | 20030176197 A | 6/2003 |
| JP | 2004066108 A | 4/2004 |
| WO | WO 98/55671 | 12/1998 |
| WO | WO 01/24921 | 4/2001 |
| WO | WO 01/36080 | 5/2001 |
| WO | WO 02/34972 | 5/2002 |
| WO | WO 03/064021 | 8/2003 |
| WO | WO 2004/053206 | 6/2004 |
| WO | WO 2004/053208 | 6/2004 |
| WO | WO 2004/071649 | 8/2004 |
| WO | WO 2005/122232 | 12/2005 |

OTHER PUBLICATIONS

Dissertation: Cubic Boron Nitride: Stability of the Domain and new Ways of Elaboration, Translated from French by the Ralph McElroy Co., Custom Division, PO Box 4828, Austin, Texas 78765 USA.

H. Jacobs et al, "*High Pressure Ammonolysis in Solid-State Chemistry*", Materials Science, vol. 8, Chapter 5, pp. 383-427, 1982.

V. L. Solozhenko et al., "*On The Lowest Pressure of Sphaleritic Boron Nitride Spontaneous Crystallization*", J. Superhand Maker, vol. 14, No. 6, Letters to the Editor, Allerton Press, Inc., p. 64, 1992.

Mark A. Sneeringer et al, "*Milk Cartons and Ash Cans: Two Unconventional Welding Techniques*", American Mineralogist, vol. 70, pp. 200-201, 1985.

ES Itskevich, "*High-Pressure Cells for Studies of Properties of Solids* (Review)", Instruments and Experimental Techniques, vol. 42, No. 3, pp. 291-302, 1999.

Scott L. Boetttcher, "A Simple Device for Loading Gases In High-Pressure Experiments", American Mineralogist, vol. 74, pp. 1383-1384, 1989.

Andrew D. Hanser et al, "Growth, Doping and Characterization of Epitaxial Thin Films and Patterned Structures of AlN, GaN, and $Al_xGa_{1-x}N$", Diamond and Related Materials, vol. 8, pp. 288-294, 1999.

K. Lawniczak-Jablonska et al., "Polarization Dependent X-Ray Absorption Studies of the Chemical Bonds Anisotropy in Wurtzite GaN Grown at Different Conditions", Journal of Alloys and Compounds, vol. 328, pp. 77-83, 2001.

Zhong Weizhuo, "Synthetic Crystallization", (2$^{nd}$ Edition, Scientific Publication Press, ISBN 7-03-003952-1/O 689, 2 pages, Oct. 1994.

M. Bickermann et al, "Characterization of Bulk AlN With Low Oxygen Content", Journal of Crystal Growth, vol. 269, pp. 432-442, 2004.

M. Yano et al., "*Growth of Nitride Crystals, BN, AlN and GaN By Using a Na Flux*", Diamond and Related Materials, Elsevier Science Publishers, Amsterdam, NL, vol. 9, No. 3-6, pp. 512-515, Apr. 2000.

Masaichi Yano et al., "*Control of Nucleation Site and Growth Orientation of Bulk GaN Crystals*", Japanese Journal of Applied Physics, Publication Office Japanese Journal of Applied Physics, Tokyo, Japan, vol. 38, No. 10A, Part 2, pp. L1121-L1123, Oct. 1, 1999.

Joseph W. Kolis et al., "Materials Chemistry and Bulk Crystal Growth of Group III Nitrides in Supercritical Ammonia", Materials Research Society, vol. 495, pp. 367-372, 1998.

Masato Aoki et al., "Growth of 5 mm GaN Single Crystals at 750° C. From An Na-Ga Melt", American Chemical Society, Crystal Growth & Design, vol. 1, No. 2, pp. 119-122, Feb. 3, 2001.

S. Porowski, "Near Defect Free GaN Substrates", High Pressure Research Center, Polish Academy of Sciences, Sokolowska 29/37, 01-142 Warsaw, Poland, sylvek@unipress.waw.pl, 11 pages, 1999.

S. Porowski et al., "Growth of GaN single Crystals Under High Nitrogen Pressure", High Pressure Research Center, Polish Academy of Sciences, ul. Sokolowska 29/37, 01-142, Warsaw, Poland, Chapter 9, pp. 295-313, 1997.

APPARATUS FOR PRODUCING SINGLE CRYSTAL AND QUASI-SINGLE CRYSTAL, AND ASSOCIATED METHOD

CROSS-REFERENCE TO RELATED APPLICATIONS

This application is a continuation-in-part of application Ser. No. 10/063,164, filed Mar. 27, 2002, now U.S. Pat. No. 7,063,741 and claims benefit therefrom, the contents of which are incorporated by reference in their entirety.

BACKGROUND

1. Technical Field

The invention includes embodiments that may relate to a single crystal and quasi-single crystal. The invention includes embodiments that may relate to a composition for forming single crystal and quasi-single crystal. The invention includes embodiments that may relate to an apparatus for forming single crystal and quasi-single crystal. The invention includes embodiments that may relate to a method for forming single crystal and quasi-single crystal.

2. Discussion of Related Art

Quasi-single crystal nitrides may be grown by vapor-phase methods, which may employ non-nitride substrates as seeds or substrates to produce quasi-single crystals. Vapor-phase methods may include hydride or halide vapor phase epitaxy, HVPE, and sublimation growth. Control of spontaneous nucleation may be problematic using a non-epitaxial substrate, which may prevent the growth of desirable single crystals. Crystal growth may occur in supercritical fluid. However, the growth rate achievable using conventional autoclaves at mild conditions (temperature less than about 550 degrees Celsius, and pressure less than about 6 kbar) may be undesirably low, and the use of more extreme conditions may require specialized equipment.

Some methods have been disclosed for nitride growth from a flux. A flux is a solvent that is a solid at room temperature. A flux for gallium nitride growth may be molten gallium. However, the vapor pressure of nitrogen gas in contact with the molten gallium may be undesirably high at temperatures sufficiently high for viable crystal growth rates. Such conditions, again, may necessitate the use of specialized equipment. In addition, the growth rates may be undesirably low due to the low solubility and the low diffusion coefficient of nitrogen in molten gallium metal. Small growth rates of gallium nitride in liquid Na/Ga alloys have also been achieved at moderate pressures (about 50 bar). The solubility of nitrogen in liquid Na/Ga alloys is relatively low. The relatively low solubility may limit crystal grow rate and/or maximum crystal size.

Static configurations used for crystal growth, where there is no motion between the hot zone and the growing crystal, may limit crystal grow rate and/or maximum crystal size. A dynamic configuration may include a crystal pulling apparatus, such as a Bridgman apparatus or an apparatus set up for the Czochralski technique. However, the solubility of nitrogen in the flux is relatively low. The dynamic process may be difficult to control because the flux may become supersaturated with respect to gallium nitride formation, and because of spontaneous nucleation of gallium nitride crystals remote from the seed crystal.

It may be desirable to grow Group III metal nitride crystals that are sufficiently large to serve as commercially viable substrates for electronic devices. It may be desirable to grow Group III metal nitride crystals that are of high quality and have low concentrations of impurities and dislocations. It may be desirable to grow Group III metal nitride crystals at a high growth rate.

BRIEF DESCRIPTION

In one embodiment, an apparatus includes a crucible, an energy source, and a controller. The crucible may be sealed to a nitrogen-containing gas, and may be chemically inert to at least ammonia at a temperature in a range of about 400 degrees Celsius to about 2500 degrees Celsius. The energy source may supply thermal energy to the crucible. The controller may control the energy source to selectively direct sufficient thermal energy to a predefined first volume within the crucible to attain and maintain a temperature in the first volume to be in a range of from about 400 degrees Celsius to about 2500 degrees Celsius. The thermal energy may be sufficient to initiate, sustain, or both initiate and sustain growth of a crystal in the first volume. The first temperature in the first volume may be controllable separately from a second temperature in another volume within the crucible. The first temperature and the second temperature differ from each other.

In one embodiment, a method may include disposing a flux material and a source material in a volume, the volume having a first region and a second region. A temperature may be controlled in the first region to be different than the temperature in the second region, and the first region temperature being sufficiently high to initiate crystal growth of the source material onto a surface of a seed crystal. A spatial location of the first region in the volume may be changed during crystal growth such that crystal growth propagates outward from the seed crystal surface toward the first region. Wherein, changing the spatial location may include one or more of applying energy at differing intensities to varying locations within the volume; or translating the energy source relative to the volume.

The method for forming a single crystal or quasi-single crystal in a sealable reaction vessel having an inner chamber may include providing a source material and a flux material into the chamber. The source material may include at least one Group III metal and at least one nitrogen-containing material. The flux material may include one or more of a phosphorous compound, a rare earth metal, or a material comprising an element selected from the group consisting of Li, Rb, Cs, Mg, Ca, Sr, Ba, Sc, Ti, V, Cr, Mn, Fe, Co, Ni, Cu, Zn, Y, Zr, Nb, Mo, Pd, Ag, Hf, Ta, W, Pt, Au, Hg, Al, Tl, Ge, P, and Sb. The flux material may be a solid at about 30 degrees Celsius. The reaction vessel may be sealed. The reaction vessel may be to a predetermined temperature. A predetermined pressure may be applied to the vessel— externally, internally, or both. The predetermined pressure may be sufficiently high to suppress decomposition of a Group III metal nitride formed at the predetermined temperature. At least one single crystal or quasi-single crystal may be formed that includes a Group III metal nitride.

In one embodiment, a method for forming a single crystal or quasi-single crystal may include contacting a source material and a flux material in the crystal growth region. The source material may include a Group III metal, and the flux material may include a material selected from the group consisting of metals, phosphides, nitrides, amides, halides, and combinations of two or more thereof.

In one embodiment, the flux material may include one or more of an alkaline earth fluoronitride, urea, ammonium salt, phosphorus compound, or rare earth metal. In one embodiment, the flux material may include one or more of P, Rb, Cs, Mg, Ca, Sr, Ba, Sc, Ti, V, Cr, Mn, Fe, Co, Ni, Cu, Zn, Y, Zr, Nb, Mo, Pd, Ag, Hf, Ta, W, Pt, Au, Hg, Al, Tl, Ge, or Sb.

A crystal growth apparatus may include means for defining a volume having a first region and a second region. The volume may contain a flux material, a source material, and a seed crystal. The seed crystal may have a surface located within the first region. The apparatus may include means for controlling a temperature in the first region to be different from the temperature in the second region, and for increasing the first region temperature to be sufficiently high to initiate crystal growth of the source material at the seed crystal surface. The first and second regions may be within the volume. The apparatus may include means for changing a spatial location of the first region relative to the volume during crystal growth. The apparatus may include means for sealing the volume.

DETAILED DESCRIPTION

Figure 1:
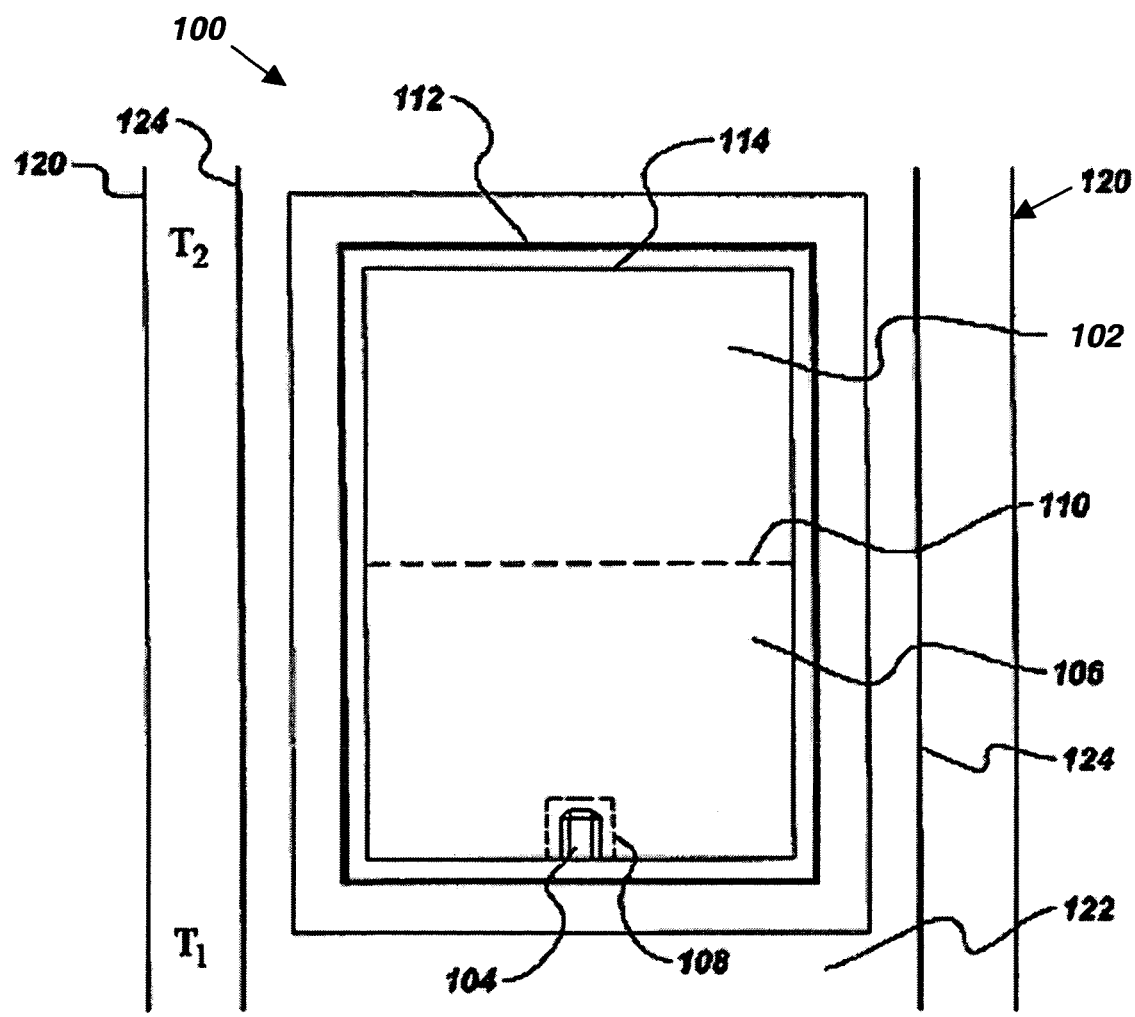
FIG. 1 is a schematic representation of a cross-section of a reaction vessel according to an embodiment as disposed in a pressure cell.

The invention includes embodiments that may relate to single crystal and quasi-single crystal. The invention includes embodiments that may relate to a composition for forming single crystal and quasi-single crystal. The invention includes embodiments that may relate to an apparatus for forming single crystal and quasi-single crystal. The invention includes embodiments that may relate to a method for forming single crystal and quasi-single crystal.

Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified, and may include values that differ from the specified value. In at least some instances, the approximating language may correspond to the precision of an instrument for measuring the value. Similarly, "free" may be used in combination with a term, and may include an insubstantial number, or trace amounts, while still being considered free of the modified term.

Single crystal and quasi-single crystal each refer to a crystalline structure that may have a relatively high crystalline quality, with a reduced number of defects. Single crystal includes material where the atoms form a uniform periodic array. A quasi-single crystal may have a predetermined range of crystal defects, for example, less than about 10,000 defects per square centimeter, or about $10^{16}$ defects per cubic centimeter. Polycrystalline material includes a plurality of randomly oriented grains where each grain may include a single crystal.

Crystal defects refers to one or more of point defects, such as vacancies, interstitials, and impurities; one-dimensional linear defects, such as dislocations (edge, screw, mixed); two-dimensional planar defects, such as tilt boundaries, grain boundaries, cleavage points and surfaces; and three-dimensional extended defects, such as pores, and cracks. Defect may refer to one or more of the foregoing unless context or language indicates that the subject is a particular subset of defect. Free of tilt boundaries means that the single crystal may have tilt boundaries at an insubstantial level, or with a tilt angle such that the tilt boundaries may not be readily detectable by TEM or X-ray diffraction; or, the crystal may include tilt boundaries that are widely separated from one another, e.g., by at least 1 millimeters or by a greater, specified distance.

Reference to gallium nitride (GaN) may be extended to include nitrides of the other Group III metals, such as aluminum, gallium, and indium, as well as mixed metal nitrides of Group III metals. In this application the U.S. convention for labeling the columns of the periodic table is used.

Suitable source material may include one or more Group III metals, Group III metal halides, or nitrides of Group III metals (Group III metal nitrides). The source material may be a powder, and the powder may be a polycrystalline, mono-crystalline, amorphous, or sintered powder. In one embodiment, the Group III metal halide may be a gallium halide. Suitable gallium halides may include one or more gallium fluorides, gallium chlorides, gallium bromides or gallium iodides. In one embodiment, the source material may comprise gallium nitride powder, polycrystalline gallium nitride, elemental gallium, or a gallium compound other than gallium nitride.

For aluminum nitride or indium nitride growth, the source material may include, for example the corresponding metal, metal halide, or metal nitride. For AlGaInN alloys, the source material may include, for example, combinations, compounds, or alloys of the gallium, aluminum, or indium source materials. In one embodiment, the source material may have an oxygen content in a range of less than about 1000 ppm. In one embodiment, the source material may have an oxygen content in a range of less than about 100 ppm. In one embodiment, the source material may have an oxygen content in a range of less than about 50 ppm. In one embodiment, the source material may have an oxygen content in a range of less than about 10 ppm. In one embodiment, the source material may be free of oxygen. The source material may include a non-oxygen oxidant, and the source material may have an oxidant content in a range of less than about 1000 ppm. In one embodiment, the source material may have an oxidant content in a range of less than about 100 ppm. In one embodiment, the source material may have an oxidant content in a range of less than about 50 ppm. In one embodiment, the source material may have an oxidant content in a range of less than about 10 ppm. In one embodiment, the source material may be free of oxidant. In other embodiments, the source material may have an amount of a combination of oxygen and another oxidant within a predefined range.

The source material may be in a relatively dense form relative to powder or loose aggregates. Densification may be achieved by cold-pressing the source material into a pill or by sintering. The source material may be heated or 'baked' at a predetermined temperature prior for densification. In one embodiment, the source material may be baked to a temperature greater than about 500 degrees Celsius, in a range of from about 500 degrees Celsius to about 1000 degrees Celsius, from about 1000 degrees Celsius to about 1500 degrees Celsius from about 1500 degrees Celsius to about 1600 degrees Celsius, or greater than about 1600 degrees Celsius. The baking may be done in a nitrogen-containing atmosphere, such as air or ammonia, or the baking may be done in an atmosphere that includes a mixture of inert gas and a nitrogen-containing gas. Suitable inert gas may include one or more of He, Ne, Ar, or Kr.

The solid source material may be brought into contact with a flux. The flux may be solid at about 30 degrees Celsius or about room temperature. At temperatures above room temperature, the flux may be molten. In one embodiment, the flux may have a melting point at a temperature in a range of greater than 100 degrees Celsius, in a range of from about 100 degrees Celsius to about 200 degrees Celsius, from about 200 degrees Celsius to about 300 degrees Celsius, from about 300 degrees Celsius to about 400 degrees Celsius, from about 400 degrees Celsius to about 500 degrees Celsius, or greater than about 500 degrees Celsius. At a predetermined temperature and pressure, the flux may become supercritical. While supercritical, the flux may have a relatively increased solubility for at least one of nitrogen, Ga, Al, or In. While supercritical, the flux may have a relatively increased solubility for at least one of gallium nitride, aluminum nitride, or indium nitride.

The flux may include one or more nitrides, amides, imides, urea and derivatives thereof, azides, ammonium salts, alkaline earth fluoronitrides, and combinations of two or more thereof. The flux may include one or more phosphates or phosphorus compounds, metal halides, metals having a significant solubility for nitrogen or that form alloys with significant nitrogen solubility, and the like. In one embodiment, the flux may include at least one metal halide, wherein the metal halide includes one or both of an alkali metal halide or an alkaline earth halide. Nitrides that may be used as the flux include, but are not limited to, lithium nitride, magnesium nitride, calcium nitride, strontium nitride, barium nitride, chromium nitride, manganese nitride, iron nitride, or copper nitride. The flux may include one or more amides. Suitable amides may include one or more of lithium amid, sodium amide, or potassium amide. Suitable azides for use in the flux include sodium azide. Ammonium salts that may be used as the flux include, but are not limited to, ammonium fluoride, ammonium chloride, ammonium bromide, and ammonium iodide.

In one embodiment, the flux may be free of ammonia. In one embodiment, the flux may have traces of ammonia. In one embodiment, the total composition of all the materials provided to a reaction vessel may include no more than about 10 percent by weight of ammonia. In another embodiment, the total composition of materials provided to the reaction vessel may include no more than about 1 percent by weight of ammonia.

Suitable flux may include one or more alkaline earth fluoronitrides. In one embodiment, the alkaline earth fluoronitride may include one or more of $Mg_2NF$, $Mg_3NF_3$, or $Ca_2NF$. In one embodiment, the flux may consist essentially of alkaline earth fluoronitride.

Suitable flux may include one or more metals. The flux may include one or more phosphates or phosphorus compounds. In one embodiment, phosphates or phosphorus compounds may include one or more of sodium metaphosphate, lithium phosphamide, or phosphorus nitride. In one embodiment, the metals may include one or more of Li, Na, K, Rb, Cs, Mg, Ca, Sr, Ba, Sc, Ti, V, Cr, Mn, Fe, Co, Ni, Cu, Zn, Y, Zr, Nb, Mo, Pd, or Ag. In one embodiment, the metals may include one or more of Hf, Ta, W, Pt, Au, Hg, Al, Ga, In, Tl, Ge, Sn, Sb, Pb, or Bi. Suitable metals may include one or more rare earth metals. In one embodiment, the rare earth metal may include one or both of a lanthanide series metal or an actinide series metal. Suitable lanthanide series metal may include one or more of Lanthanum, Cerium, Praseodymium, Neodymium, Promethium, Samarium, Europium, Gadolinium, Terbium, Dysprosium, Holmium, Erbium, Thulium, Ytterbium, or Lutetium. Suitable actinide series metal may include one or more of Actinium, Thorium, Protactinium, Uranium, Neptunium, Plutonium, Americium, Curium, Berkelium, Californium, Einsteinium, Fermium, Mendelevium, Nobelium, or Lawrencium. In one embodiment, the rare earth metal may be present in an amount such that a non-radioactive isotope of the rare earth metal is more than half of the amount present by weight.

The flux may be formed in situ, that is by reaction of a precursor with the source material and/or with a controlled atmosphere. The flux may be an intermediate-strength nitride former or moderate-stability nitride, or a mixture or compound of a strong nitride former (or stable nitride) and a weaker nitride former (or a less stable nitride. Alternatively, the flux may include compounds formed by reaction of the aforementioned flux with reagents containing at least one Group III metal (e.g., $GaCl_3$). In one embodiment, the flux is baked at a temperature in a range of from about 80 degrees Celsius to about 1200 degrees Celsius in an oxygen-free atmosphere, such as vacuum, at least one inert gas, such as He, Ne, Ar, or Kr, and at least one of ammonia and nitrogen. In order to efficiently use the space within reaction vessel, the flux may be pre-processed, such as densified and consolidated, by one or more of cold pressing, sintering, or hot pressing.

In one particular embodiment, the flux may be molten and/or supercritical under growth conditions, and may have a relatively increased solubility for at least one of nitrogen, Ga, Al, In, gallium nitride, AlN, and InN. In one embodiment, the flux may be free of ammonia. In another embodiment, the total composition of materials provided to the reaction vessel may include no more than about 1% by weight of ammonia. In one embodiment, traces of ammonia may be present, but the total composition of materials provided to the reaction vessel may include no more than about 10% by weight of ammonia.

Suitable solvent materials include: (i) nitrides, such as $Li_3N$, $Mg_3N$, $Ca_3N$, $Sr_3N$, $Ba_3N$, $CrN_x$; $MnN_x$; $FeN_x$, and $CuN_x$, where x may be greater than 1; (ii) amides, such as $LiNH_2$, $NaNH_2$, and $KNH_2$; (iii) urea and related compounds; (iv) azides, such as NaN3; (v) ammonium salts, such as $NH_4F$, $NH_4Cl$, $NH_4Br$, or $NH_4I$; (vi) halides, such as KF, KCl, and NaCl; (vii) phosphates or phosphorus compounds, such as $NaPO_3$ LiPN, or $P_3N_5$; (viii) compounds formed by reaction of the aforementioned with gallium reagents such as $GaCl_3$; and (ix) metals with a significant solubility for N or that form alloys with significant N solubility; (x) compounds, combinations, or mixtures of two or more of the above. Such alloys with significant N solubility may include at least one of Li, Na, K, Rb, Cs, Mg, Ca, Sr, Ba, Sc, Ti, V, Cr, Mn, Fe, Co, Ni, Cu, Zn, Y, Zr, Nb, Mo, Pd, Ag, a rare earth metal, Hf, Ta, W, Pt, Au, Hg, Al, Ga, In, Tl, Ge, Sn, Sb, Pb, and Bi Suitable flux may include metallic alloys, and may include compounds such as halides and mixed halides and phosphates. Metallic flux systems included gallium and at least one of the following metals: Ti, V, Cr, Mn, Fe, Co, Ni, Cu, Zn, Pb, Bi and Li. Compound flux systems included: KF, KF—KCl, KF with addition of a nitride such as $Ca_3N$, $Mg_3N$ and $Li_3N$.

The source material may be mixed with the flux and compacted prior to disposition in a growth cell. Compaction may be carried out, for example, using uniaxial pressing in a die, isostatic pressing, or the like.

In one embodiment, the source material may be brought into contact with the flux by first mixing both materials together and pressing the mixture into a pill. The source material/flux pill may be placed in a reaction vessel and processed under high pressure and high temperature conditions. Such conditions may include processing pressures ranging from about 1 atmosphere to about 80 kbar, and processing temperatures in a range of from about 500 degrees Celsius to about 3000 degrees Celsius. Under such conditions, some or all of the source material dissolves in the flux. Ostwald ripening may occur, large and well-crystallized Group III metal nitride crystals may grow, while smaller and less-well-crystallized crystals of the Group III metal nitride may shrink. Additional single crystals of the Group III metal nitride may precipitate from the flux upon cooling of the reaction vessel.

In one embodiment, a crucible may be used to contain the source and flux. Preferably, the crucible for the source and flux is inert with respect to chemical reaction with either source or flux. The crucible may include at least one layer. Each layer of the crucible may be in a range of from about 1 millimeter to about 25 millimeters thick, for example. The innermost layer of the crucible may include, for example, gold, silver, platinum, palladium, iridium, ruthenium, rhodium, osmium, copper, copper-based alloy, titanium, vanadium, chromium, iron, iron-based alloy, nickel, nickel-based alloy, zirconium, niobium, molybdenum, tantalum, tungsten, rhenium; graphite; glassy carbon; $MC_xN_yO_z$, wherein M is at least one of aluminum, boron, gallium, silicon, titanium, vanadium, chromium, yttrium, zirconium, lanthanum, a rare earth metal, hafnium, tantalum, tungsten, and wherein each of x, y, and z is between 0 and 3 (i.e., 0<x, y, z<3); and combinations thereof. The innermost layer may also be formed in situ, that is, by reaction between a precursor material and the source material and/or flux.

Oxygen and oxygen-containing gases, such as water, may be excluded from the controlled atmosphere surrounding the crystal during growth. Each of the metal nitrides MN (M=Ga, Al, or In) may decompose to $M+\frac{1}{2}N_2$ at temperatures well below their melting points.

Nitrogen may be present in the controlled atmosphere during processing as diatomic nitrogen, or as a nitrogen-containing gas such as ammonia or hydrazine. The presence of nitrogen in the controlled atmosphere may maintain the nitrogen activity in the gas above an equilibrium value with the metal nitride. Maintaining the nitrogen activity may prevent or reduce the subsequent decomposition of the metal nitride after formation. The metal and the metal nitride may be reactive with oxygen, forming $M_2O_3$ as well as incorporating oxygen atoms as dopants. In one embodiment, oxygen and oxygen-containing gases, such as water, may be excluded from the controlled atmosphere during growth.

Suitable seed crystals may be a native crystal, i.e., of approximately the same composition of the crystal being grown, e.g., gallium nitride. In one embodiment, the seed crystal may be larger than 1 millimeter in diameter and of high crystalline quality, with a dislocation density less than $10^4$ per square centimeter and free of tilt or grain boundaries. Suitable gallium nitride seed crystals may include an epitaxial $Al_xIn_yGa_{1-x-y}N$ layer on a non-GaN substrate such as sapphire or silicon carbide. Suitable gallium nitride seed crystals may include a free-standing $Al_xIn_yGa_{1-x-y}N$ film grown by HVPE, sublimation, or metal organic chemical vapor deposition (MOCVD). Suitable seed crystals may include non-$Al_xIn_yGa_{1-x-y}N$ materials. In one embodiment, the seed crystal may include one or more of sapphire, silicon carbide, $LiAlO_2$, $LiGaO_2$, or the like.

Differing seed crystals may have differing crystallographic orientations, which may be selected with reference to application specific parameters. Gallium nitride crystals grown from seeds may be terminated predominantly by (0001), (000 $\bar{1}$), and (1 $\bar{1}$ 00) facets, and all these orientations may be suitable for a seed crystal surface. The (11 $\bar{2}$ 0) surface may constitute a favorable seed surface orientation. In one embodiment, the crystallographic orientation of the seed crystals may be within about 10 degrees of one of the (0001) orientation, the (000 $\bar{1}$) orientation, the (10 $\bar{1}$ 0) orientation, the (11 $\bar{2}$ 0) orientation, or the (10 $\bar{1}$ 1) orientation.

In one embodiment, a seed crystal may be used to initiate crystal growth. The seed crystal may be a single crystal and may include the same material as the crystal being grown (i.e., the target crystal). For example, a gallium nitride seed crystal may be used to initiate gallium nitride crystal growth.

Suitable seed crystals may be selected with reference to their defect density. In one embodiment, the seed crystal may be free of tilt boundaries. In one embodiment, the seed crystal may have a dislocation density less than about 10,000 per square centimeter. In one embodiment, the seed crystal may have a dislocation density less than about 1000 per square centimeter. In one embodiment, the seed crystal may have a dislocation density less than about 100 per square centimeter. In one embodiment, the seed crystal may have a dislocation density of less than about $10^{15}$ per cubic centimeter. The dislocations may be edge dislocations, screw dislocations or a combination of the two, that is, mixed dislocations. The dislocation may engage in motion (slip) by sequential bond breaking and bond reforming. The number of dislocations per unit volume may be the dislocation density, but in a plane the dislocation density may be measured per unit area. There may be strain around each dislocation, which may influence how the dislocation may interact with other dislocations, impurities, tilt boundaries, and the like. There may be compression near the extra plane provided by the dislocation and tension following the dislocation line. The compression may provide a higher atomic density. Dislocations may interact among themselves. When dislocations are in the same plane, the may repel each other if they have the same sign, and annihilate each other if they have opposite signs. Proximately spaced dislocations, and their strain fields, may repel each other because of an increase in the potential energy required to strain a region of the seed crystal.

With reference to FIG. 1, a reaction vessel 100 may have a source material 102 contained within, and disposed at one end, a volume defined by an inner surface of the reaction vessel 100. A crystalline Group III metal nitride seed crystal 104 may be placed in an end of the reaction vessel 100 opposite of the source material 102. A flux 106 may be placed between the source material 102 and the seed crystal 104. A diffusion barrier 108 may enclose a least a portion of the volume inside the reaction vessel 100, and further enclose the seed crystal 104. A baffle 110 may separate the source material 102 from a main body of flux (not labeled). The reaction vessel 100 may include a liner 112 disposed on the inner surface of the reaction vessel 100, and a coating 114 disposed on an inner surface of the liner 112. Once filled and sealed, reaction vessel 100 may be placed into a reaction cell 120. The reaction cell 120 may include a pressure transmission medium 122 and a heating element 124.

In an alternative embodiment, a non-Group III metal nitride seed (i.e., a seed material other than a Group III metal nitride) may be placed in the reaction vessel in the end opposite source material. The non-Group III metal nitride seed may have a lattice constant within about 20 percent of that of the Group III metal nitride crystal to be grown. The non-Group III metal nitride seed crystal may have a lattice constant within about 5 percent of that of the target Group III metal nitride crystal. In the case of gallium nitride or aluminum nitride, a seed crystal that includes silicon carbide or sapphire may be employed.

The diffusion barrier may reduce dissolution of a crystalline Group III metal nitride seed prior to the onset of growth. Suitable diffusion barriers may include a thin foil of a suitable material may protect the crystalline Group III metal nitride seed. Suitable material may include one or more of platinum, tantalum, and the like. The crystalline Group III metal nitride seed may be wrapped within the diffusion barrier, or the diffusion barrier may be positioned to separate the seed and a small quantity of flux from the main body of flux.

Fluid communication between the source material and a main body of the flux may be provided by through apertures (indicated by the dash line) extending through the baffle. The perforated baffle may have a fractional open area in a range of greater than about 1 percent, in a range of from about 1 percent to about 20 percent, from about 20 percent to about 30 percent, from about 30 percent to about 40 percent, or greater than about 40 percent.

Positioning of the source material, flux, and crystalline Group III metal nitride seed within reaction vessel may be determined with reference to the relative densities of each material. For example, gallium nitride may have a density of about 6.1 g/cc. If, under some gallium nitride growth conditions, the density of flux is greater than that of gallium nitride then any spontaneously nucleated gallium nitride crystals may float upward. In this case, the source material may be arranged to be initially at the top of the reaction vessel, while the crystalline Group III metal nitride (GaN) seed crystal may be arranged to be initially at one end of the reaction vessel, as shown in FIG. 1. Conversely, if the flux has a density less than that of gallium nitride under growth conditions, any spontaneously-nucleated gallium nitride crystals may sink to the bottom (in a vertically oriented configuration) of the reaction vessel. The arrangement of source material and crystalline Group III metal nitride (GaN) seed may be inverted from that shown in FIG. 1; i.e., with crystalline Group III metal nitride (GaN) seed located at the top of reaction vessel. Control of the temperature within the reaction vessel may allow for differing temperatures at spatially differing locations. Such control over the temperature at the differing locations may allow for the growth of the crystal at predetermined locations within the reaction vessel. Such control over the temperature at the differing locations may allow for the suppression of crystal growth at other predetermined locations within the reaction vessel.

The reaction vessel may be sealable and impermeable with respect to nitrogen. The reaction vessel may be chemically inert with respect to both source material and the flux under crystal growth conditions. Particular sealing techniques may be required for seal structure integrity at operating temperatures and/or pressures. Further, sealing techniques may be influenced by the selection of materials for the sealing structure. Once filled and sealed, the reaction vessel may undergo a passivation reaction with other cell components such as the source material and/or the flux.

In one embodiment, the reaction vessel, baffle, liner, and coating each may include one or more material selected from copper; silver; gold; platinum; palladium; iridium; rhodium; ruthenium; osmium; rhenium; iron; nickel; or phosphorus. In one embodiment, the reaction vessel, baffle, liner, and coating each may include one or both of graphite or glassy carbon. In one embodiment, the reaction vessel, baffle, liner, and coating each may include one or more of pyrophyllite; talc; olivine; calcium carbonate; merylinite clay; bentonite clay; or sodium silicate. In one embodiment, the reaction vessel, baffle, liner, and coating each may include one or more material defined by $MC_xN_yO_z$, wherein M may be a metal selected from magnesium, calcium, strontium, barium, aluminum, boron, gallium, silicon, titanium, vanadium, chromium, yttrium, zirconium, lanthanum, hafnium, tantalum, tungsten, molybdenum, or niobium, and wherein $0 \leq x$, $y \leq 3$, and $z \leq 3$. In one embodiment, the reaction vessel, baffle, liner, and coating each may include one or more material defined by $MC_xN_yO_z$, wherein M may be a rare earth metal.

The liner and the coating may include a material that is different from that (or those) used to form the reaction vessel. In one embodiment, reaction vessel may have a melting point at a temperature that is greater than about 1600 degrees Celsius. The reaction vessel may be gas tight upon initial filling and sealing, or may become gas tight during processing at high pressure and high temperature.

The heating element may include at least one of graphite, niobium, titanium, tantalum, iron, nickel, chromium, zirconium, molybdenum, tungsten, rhenium, hafnium, platinum, or silicon. The heating element may include one or more of stainless steel, silicon carbide, or nichrome. The heating element may be a resistively heated tube, foil, ribbon, bar, wire, or combinations thereof. Other suitable heating elements may provide energy that may be converted to thermal energy, such as electricity, microwave energy, or radio frequency energy. A housing capable of transmitting such energy may be desirable to use with such an energy source. Further, a susceptor or equivalent may be used to help control the location of the conversion to thermal energy, and optionally the rate of energy conversion.

The pressure transmission medium may be thermally stable at least up to the temperature at which crystal growth of the Group III metal nitride takes place. During processing, the pressure transmission medium may remain a solid with relatively low shear strength and relatively low internal friction. The pressure transmission medium may have an internal friction in a range of less than about 1, in a range of from about 1 to about 0.5, from about 0.5 to about 0.2, or less than about 0.2.

Suitable pressure transmission medium may include an alkali halide. In one embodiment, the alkali halide may include one or more of NaCl, NaBr, or NaF. Other suitable pressure transmission medium may include one or more of talc; pyrophyllite; sulfides (e.g., molybdenum disulfide); carbon-based materials, such as graphite or calcium carbonate; nitrides, such as boron nitride (e.g., hexagonal); metal halides, such as silver chloride, calcium fluoride, and strontium fluoride; metal oxides, such as aluminum oxide, silica, magnesium oxide, or zirconium oxide; or, clays or silicates, such as merylinite clay, bentonite clay, or sodium silicate.

The reaction cell containing the reaction vessel may be placed in a high-pressure apparatus (not shown). In one embodiment, the high-pressure apparatus may include a belt-type apparatus, with a reinforced die and at least two punches or anvils. Alternatively, the high-pressure apparatus may include one of a piston press, a multi-anvil press with at least four anvils, a toroid-type apparatus with two recessed anvils, or a split-sphere apparatus.

A controller (not shown) may interact and communicate to and with the heating element and temperature sensors (not shown). The controller may control the heating element to achieve and/or maintain differing temperatures in differing locations in the volume defined by the reaction vessel.

In one embodiment, a temperature gradient across a defined region within the crucible may be generated by locating the reaction vessel asymmetrically within the heating zone of the reaction cell. The distance from an end of the reaction vessel to a cell boundary may be greater than the distance from the cell boundary to another end of the reaction vessel. Alternatively or additionally, the temperature gradient may be produced by providing a heating element having a non-uniform resistivity along its length. Non-uniform resistivity may be achieved by providing a heating element having at least one of a non-uniform thickness, perforations at selected points, and a laminate structure of at least two materials of differing resistivity at selected points along its length.

Optionally, a plurality of independent temperature sensors (not shown) may measure and communicate information with a controller. The controller may control the temperature gradient between opposing ends of the reaction vessel. The temperature differential may be achieved either by providing one or more auxiliary heaters (not shown) proximate to one end of the reaction vessel, or by differentially cooling one end of the reaction vessel. Cooling may be achieved, for example, by providing a coolant at differing temperatures to each of the two ends of the apparatus. The temperature gradient may be adjusted, changed, translated, or maintained during single crystal growth to optimize quality and growth rate. Such adjustment, change, or translation may be performed in a gradual manner of transmission, or may be performed stepwise with discrete transition periods.

Optionally, for growth of indium nitride and gallium nitride crystals, the reaction vessel may be pressurized to greater than about 5 kbar, in a range of from about 5 kbar to about 10 kbar, from about 10 kbar to about 20 kbar, from about 20 kbar to about 30 kbar, from about 30 kbar to about 40 kbar, from about 40 kbar to about 50 kbar, from about 50 kbar to about 60 kbar, from about 60 kbar to about 70 kbar, from about 70 kbar to about 80 kbar, or greater than about 80 kbar. The reaction vessel may be heated to a temperature in a range of from about 1200 degrees Celsius to about 3000 degrees Celsius. The temperature may be sufficient to melt the source material at one end of a reaction vessel, while the pressure may be sufficient to inhibit decomposition. The approximate melting point of aluminum nitride may be about 3200 degrees Celsius, and the nitrogen (nitrogen) pressure needed to inhibit decomposition may be about 0.2 kbar. For gallium nitride, the approximate melting point may be about 2200 degrees Celsius, and the nitrogen gas pressure needed to inhibit decomposition may be about 60 kbar. The approximate melting point of indium nitride may be about 1900 degrees Celsius, and the nitrogen (nitrogen) pressure needed to inhibit decomposition may be about 60 kbar.

During processing, one end of reaction vessel may be maintained at a higher temperature (T2 in FIGS. 1 and 2) than the opposite end of reaction vessel (T1 in FIGS. 1 and 2), with the temperature differential being in a range of greater than about 1 degree Celsius. In one embodiment, the differential may be in a range of from about 1 degree Celsius to about 5 degrees Celsius, from about 5 degrees Celsius to about 50 degrees Celsius, from about 50 degrees Celsius to about 100 degrees Celsius, from about 100 degrees Celsius to about 200 degrees Celsius, from about 200 degrees Celsius to about 250 degrees Celsius, or from about 250 degrees Celsius to about 300 degrees Celsius.

After being held for a predetermined time at a relatively high pressure and temperature, the reaction vessel may be cooled at a predetermined cooling rate. Suitable cooling rates may be greater than about 0.02 degrees Celsius. In one embodiment, the cooling rate may be in a range of from about 0.02 degrees Celsius/hour to about 1 degrees Celsius/hour, from about 1 degrees Celsius/hour to about 10 degrees Celsius/hour, or from about 10 degrees Celsius/hour to about 100 degrees Celsius/hour. The cooling rate may be selected so that a single gallium nitride crystal nucleates at the "cold"—or low temperature (T1 in FIGS. 1 and 2)—end of the reaction vessel. The remaining molten Group III metal nitride may crystallize onto the single nucleated crystal as the reaction vessel cools to a temperature less than the melting point of the Group III metal nitride.

Figure 2:
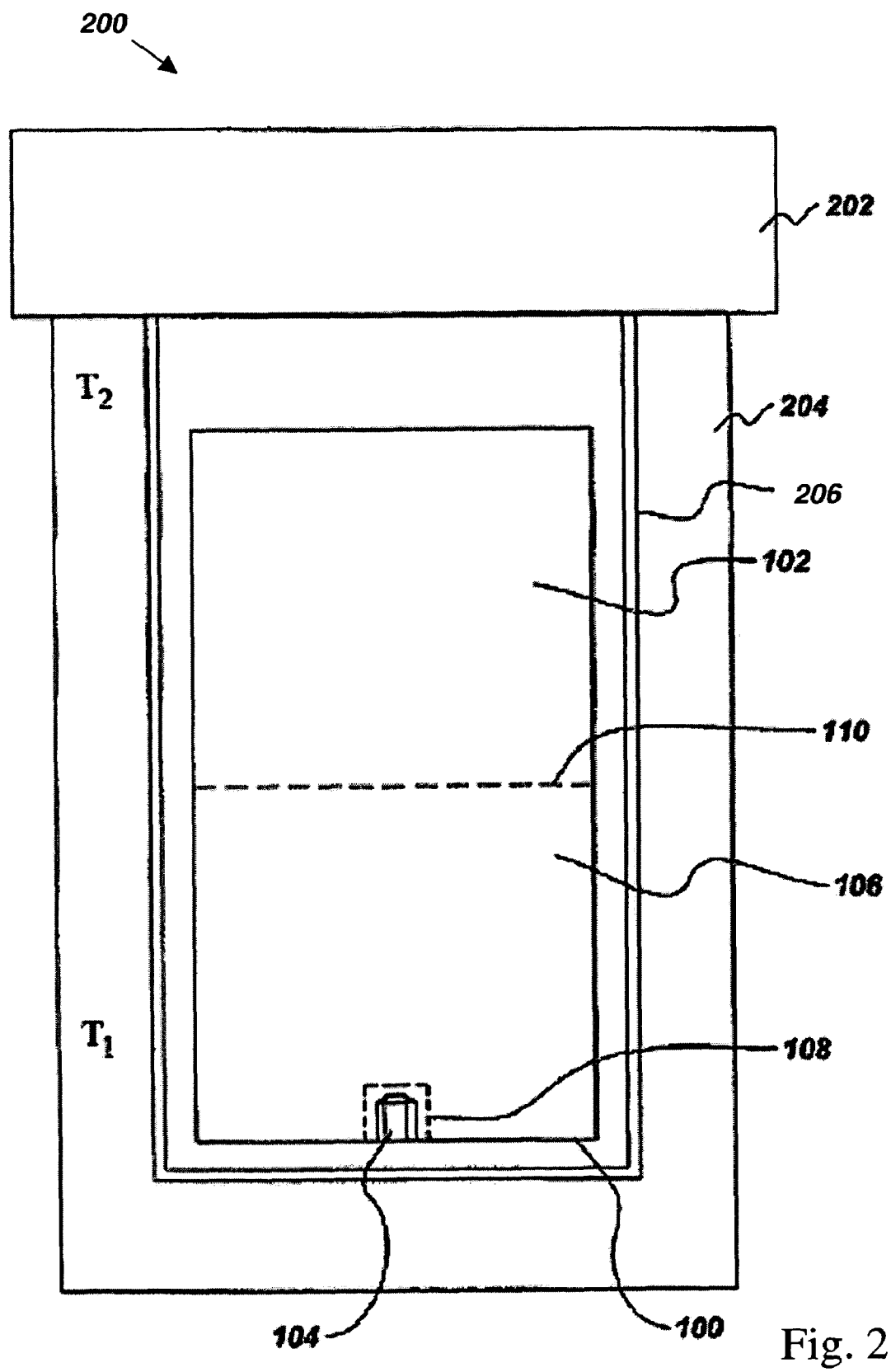
FIG. 2 is a schematic representation of a cross-section of a reaction vessel according to an embodiment as disposed in an autoclave.

With reference to FIG. 2, an autoclave 200 suitable for use as a pressure apparatus is illustrated. Suitable autoclaves may include a Morey autoclave, a Tuttle/Roy cold-cone seal autoclave, a modified Bridgman autoclave, a full Bridgman autoclave, a delta ring autoclave, or a Walker-Buehler type autoclave. The seed crystal, flux, and source material may be placed in a volume defined by an inner surface of the autoclave 200. A sealable lid 202 may be secured to a housing 204 into which the reaction vessel 100 may be placed.

A chemically inert outer liner 206 may be inserted into autoclave 200 between the reaction vessel 100 and the inner surface of the housing 204. A heating element or a furnace external to the outer wall of autoclave 200 may supply thermal energy to the reaction vessel under the control of a controller (not shown).

Figure 3:
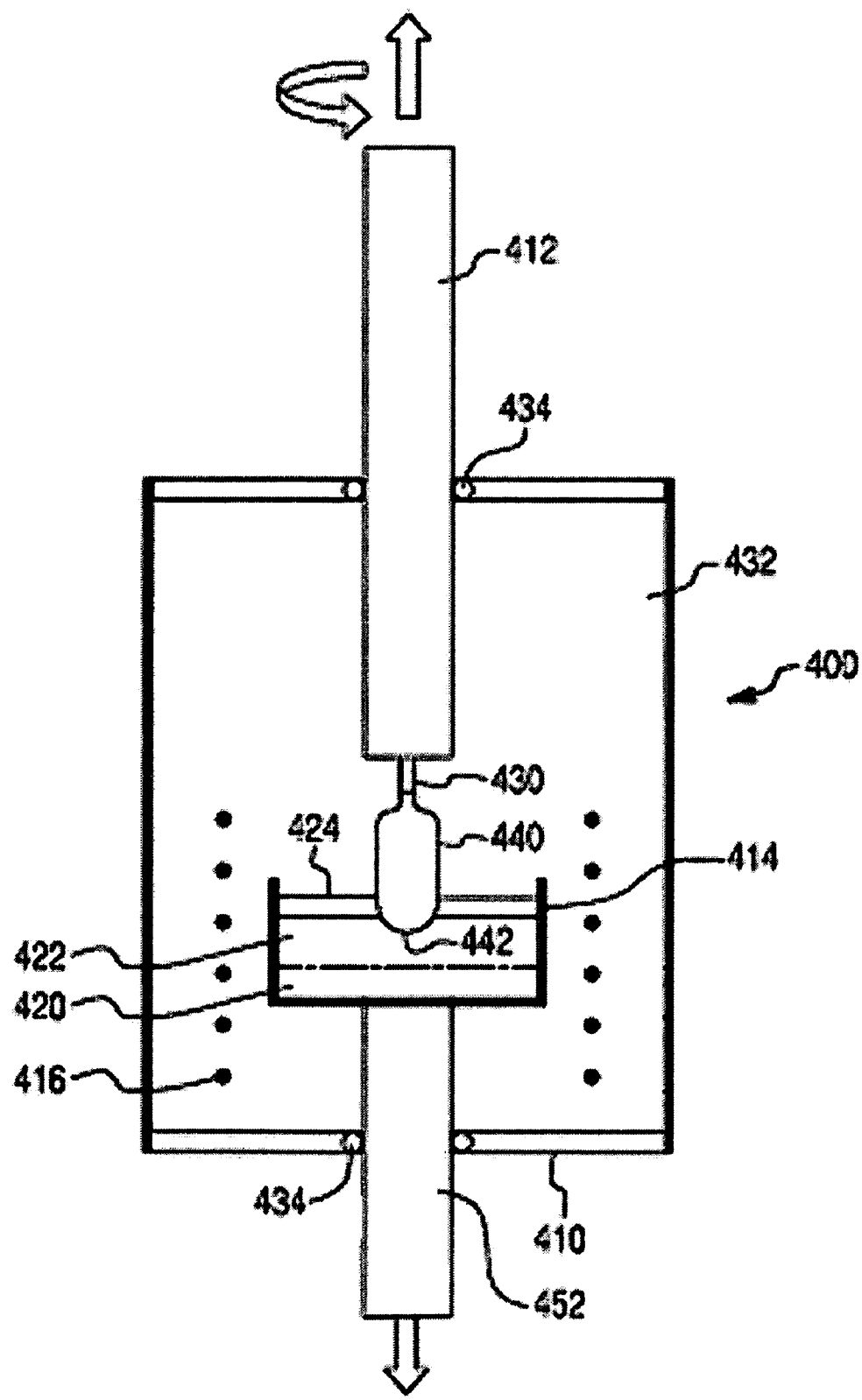
FIG. 3 is a schematic of a growth furnace according to one embodiment of the invention.

With reference to FIG. 3, an apparatus 400 according to an embodiment of the invention is illustrated as a growth furnace. The growth furnace 400 may a top-seeded solution growth apparatus, and may include one or more furnace walls 410, a mandrel 412, and a crucible 414 formed of inert material. The walls 410 have an inner surface that defines an inner volume 432 in which heating elements 416 and the crucible 414 may be disposed. The mandrel 412, and a crucible support 452, if present, may extend though an aperture at a seal 434 in the walls 410. Source material 420 and a flux 422 may be disposed in the crucible 414, and may be placed in thermal communication with the heating elements 416. A seed crystal 430 may be attached to and end of the mandrel 412. Optionally, an encapsulant 424, such as liquid encapsulant $B_2O_3$, may be disposed adjacent to the flux 422 and to the source material 420.

During use, the mandrel can be rotated and translated. The seed crystal may be lowered into the flux, and may be raised and/or rotated by manipulation of the mandrel as crystal growth initiates and continues to form a target crystal 440 that grows at a growth interface surface 442. The crucible support may translate vertically and, optionally, rotate. In one embodiment, the crucible may move instead of, or in addition to, motion by the seed crystal.

If present, the encapsulant may reduce volatilization of the flux during operation and crystal growth. By definition, the encapsulant may be at least partially immiscible in the flux. That is, the encapsulant may have a low solubility in the flux, and there may be a low solubility of the flux in the encapsulant. Further, the source material may have a relatively low solubility in the encapsulant. Because of specific gravity differences, and relative insolubilities, the encapsulant may remain disposed on top of the flux during crystal growth to function as a seal. Suitable encapsulants may have a solubility of less than about $10^{-5}$ mole fraction relative to the flux, or relative to the source material. In one embodiment, the solubility of less than about $10^{-3}$ mole fraction. Increasing insolubility may allow for decreased pressure. Decreasing the pressure may reduce decomposition of the target crystal, or sublimation after formation.

The gas-tight seal may allow the mandrel or the crucible support to extend through the walls while maintaining pressure in the furnace volume. Suitable seals may include a sliding/rotating seal for the mandrel and the crucible support. The gas-tight seal may include an o-ring seal, a Teflon seal, a ferrofluidic seal, a bellows seal, or the like. The interior volume may be sealed to be airtight. The sealing function may allow for a controlled atmosphere within the furnace volume during crystal growth, that is, at operational temperature and/or pressure. A composition of the controlled atmosphere within the furnace volume may include one or more nitrogen-containing materials.

In addition to a sealable furnace volume, the crucible may be sealed against leakage of a nitrogen-containing gas. The crucible may be relatively chemically inert to ammonia at a temperature in a range of about 400 degrees Celsius to about 2500 degrees Celsius. The energy source may supply thermal energy to the crucible. The controller may control the energy source to selectively direct sufficient thermal energy to a predefined first volume within the crucible, and to attain and maintain a temperature in the first volume in a range of from about 400 degrees Celsius to about 2500 degrees Celsius. The thermal energy supplied may be sufficient to initiate, sustain, or both initiate and sustain the growth of a crystal in the first volume. The controller may direct the energy source such that the first temperature in the first volume may be controllable separately from a second temperature in another volume within the crucible. The controller may control the energy source so that the first temperature and the second temperature differ from each other.

Some of the source material may dissolve within the flux. The source material may be mixed, or pre-mixed, with some of the flux. The flux and the source material may be disposed within the crucible by admixing the flux and the source material, for example, or adjoining the flux and the source material such that the flux is adjacent to the source material. In one embodiment, the source material may be pressed into a pill. Separately, the flux may be pressed into a sleeve and placed around the pill such that the sleeve makes contact with the pill. The pill and surrounding sleeve may be placed inside the reaction vessel. The flux maintains the chemical potential of nitrogen within the reaction vessel at a sufficiently high level that, after processing, stoichiometrically controlled Group III metal nitride may be obtained.

In one case, the solubility of the source material in the flux may increase as a function of temperature; and, the driving force for crystallization may be the decreasing solubility of the source material in the flux with decreased temperature. The temperature gradient region may be achieved and/or maintained such that the temperature of the crystal growth region may be relatively less than the temperature of the flux. For example, the crystal growth region may be at a lower temperature in a range of greater than about 1 degrees Celsius, or in a range of from about 1 degree Celsius to about 5 degrees Celsius, from about 5 degree Celsius to about 10 degrees Celsius, from about 10 degree Celsius to about 15 degrees Celsius, from about 15 degree Celsius to about 20 degrees Celsius, from about 20 degree Celsius to about 50 degrees Celsius, from about 50 degree Celsius to about 100 degrees Celsius, or greater than about 100 degrees Celsius, relative to the flux, the source material, or a mixture of the flux and the source material. As the crystal withdraws the flux, with dissolved source material therein, may contact the cool crystal, and the source material may supersaturate and precipitate out of solution onto the crystal at the crystal growth region.

Conversely, if the solubility of the source material in the flux decreases with temperature, the driving force for crystallization may be the decreasing solubility of the source material in the flux with increased temperature. The temperature gradient region may maintain the temperature of the crystal growth region higher than the temperature of the flux. For example, the crystal growth region may be at a higher temperature than the flux below, for example, by about 1 degree Celsius to about 100 degrees Celsius. In one embodiment, the temperature differential may be in a range of from about 1 degree Celsius to about 10 degrees Celsius, from about 10 degrees Celsius to about 25 degrees Celsius, from about 25 degrees Celsius to about 50 degrees Celsius, from about 50 degrees Celsius to about 75 degrees Celsius, from about 75 degrees Celsius to about 100 degrees Celsius, or greater than about 100 degrees Celsius.

As the formed crystal is withdrawn, the temperature of the flux with dissolved source material in contact therewith increases, and the source material may precipitate out of solution onto the crystal at the crystal growth region. The growing crystal may be withdrawn from the crucible at a rate that results in a growth rate that corresponds to the rate of withdrawal. Suitable withdrawal rates, and consequently growth rates, may be in a range of greater than about 0.1 millimeters per day (mm/day), from about 0.1 mm/day to about 0.2 mm/day, from about 0.2 mm/day to about 0.5 mm/day, from about 0.5 mm/day to about 1 mm/day, from about 1 mm/day to about 5 mm/day, from about 5 mm/day to about 10 mm/day, from about 10 mm/day to about 15 mm/day, from about 15 mm/day to about 20 mm/day, from about 20 mm/day to about 25 mm/day, or greater than about 25 mm/day.

Figure 4:
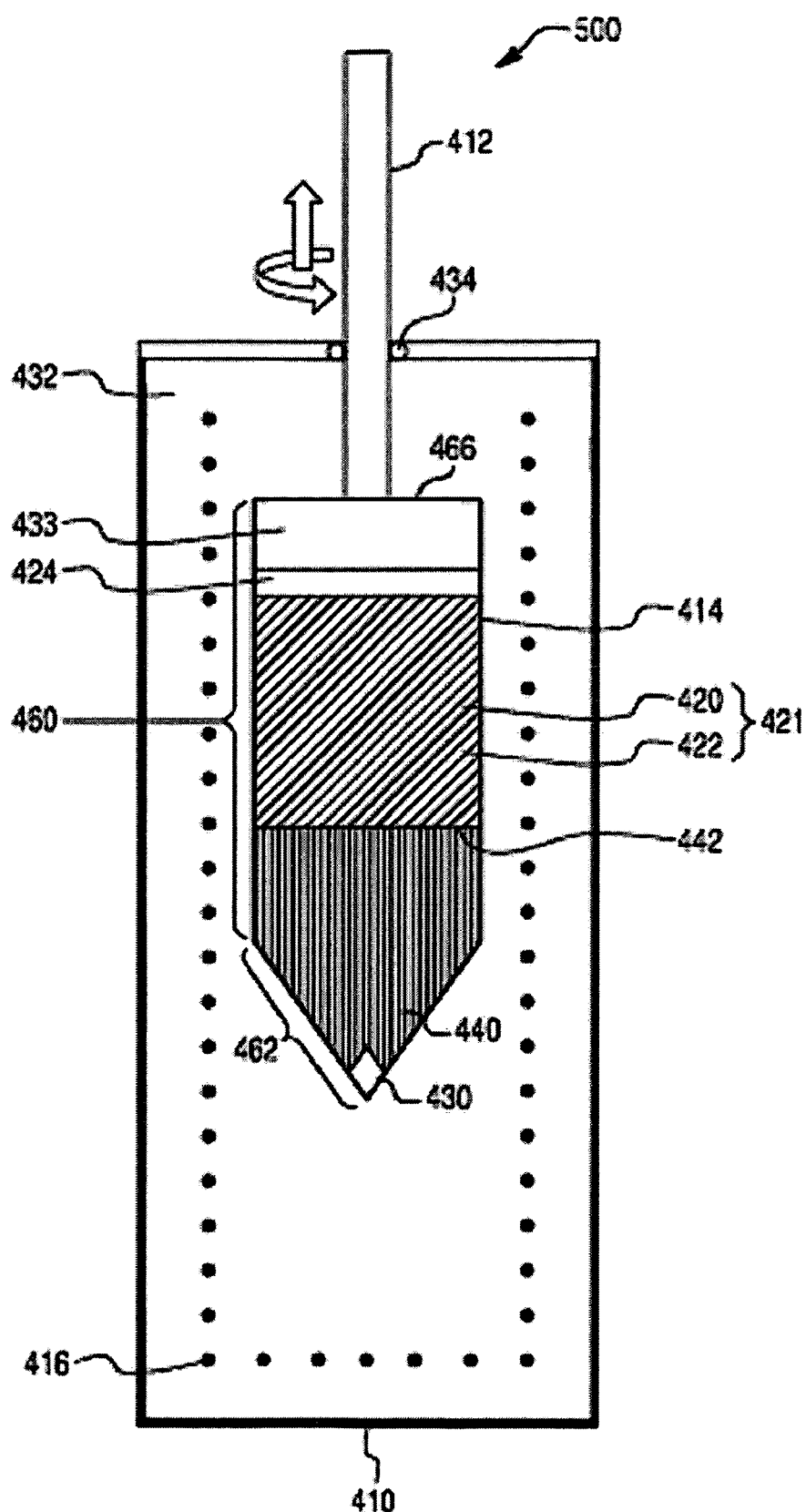
FIG. 4 is a schematic of a growth furnace according to another embodiment of the invention.

FIG. 4 illustrates another growth furnace 500. In this illustrated embodiment, a crucible 414 may have a body 460, and a bottom portion 462 that may narrow conically while extending away from the body 460. The bottom portion 462 may come to a point to facilitate single crystal nucleation. The seed crystal 430 may be disposed at an end of the bottom portion 462 of the crucible 414 to initiate single crystal growth, and may control one or more of the position, orientation, or spatial location of crystal nucleation in the crucible 414. A pre-mixed mixture 421 of the source material 420 and the flux 422 may be used. The proportions of source material 420 and flux 422 may be constant throughout the height of the crucible 414, or may differ from location to location, for example, with a higher fraction of flux 422 near one end relative to another end.

The encapsulant 424 may be disposed on top of the flux/source mixture 421 to reduce volatilization of the flux 422 during growth. The encapsulant may be immiscible in the flux, with a low solubility of the encapsulant in the flux and a low solubility of the flux in the encapsulant. The solubility of the source material in the encapsulant may also be low, for example, less than $10^{-5}$ mole fraction. The encapsulant may remain disposed on top of the flux 422 during crystal growth. A closable lid 466 may not be gas-tight to allow for equilibration of a pressure in a volume 433 defined by an inner surface of the crucible 414, relative to a pressure inside the furnace volume 432. Alternatively, the lid 466 and the entirety of the crucible 414 may be gas-tight and may be pressure-tight, and only the interior of the crucible 414 may be filled with the nitrogen-containing controlled atmosphere. In still another embodiment, the lid and the crucible may be gas-tight and pressure-tight with respect to the furnace volume but may be connected to an external gas manifold by tubing (not shown). The tubing may be a component of, and coextensive with, the mandrel.

In one embodiment, the mandrel may translate the crucible vertically with respect to the heating elements in the growth furnace. In one embodiment, the mandrel may be located below the crucible rather than above. Translation of the heating elements or the growth furnace relative to a stationary crucible may provide for increased control of temperature in the crucible, and may provide for communication with the interior of the crucible, for example, via tubing. That is, the tubing may not need to move if the crucible is stationary. Optionally, the crucible may also be rotated about its vertical axis by means of the mandrel. Rotation of the crucible, either at a constant or varying rotation speed, may aid in mixing of the flux and maintenance of constant supersaturation conditions over the entire crystal growth front of the crystal growth region.

The heating elements may be configured, and/or arrayed, to produce the desired temperature distribution, based on parameters such as power to each heating element, baffles, insulation, and optional localized cooling. Preferably, the temperature gradient may occur over a relatively short vertical distance, approximately 1 millimeter to about 10 cm. As the flux 422 saturated with dissolved source material 420 passes into the temperature gradient region, source material 420 precipitates out of solution onto the growing crystal 440 at the crystal growth region 442. The position of the crystal growth region 442 thus propagates upward with respect to the seed (if used) or the original crystal nucleus at the bottom of the crucible 414.

In one embodiment, appropriate for the case where the solubility of the source material in the flux may increase with temperature, the temperature distribution and temperature gradient is such that the crystal growth region may be at a temperature lower than the source material/flux mixture above it, with the crystal growth region within the temperature gradient region. The crystal growth region may be at a temperature lower than the source material/flux mixture by a temperature differential in a range of from about 1 degree Celsius to about 100 degrees Celsius.

In one embodiment, the solubility of the source material in the flux may decrease with temperature. In such a case, the temperature of the crystal growth region 442 may be maintained higher than the source material/flux mixture 421 above it, for example, by about $\Delta T=1$ degree Celsius to 100 degrees Celsius.

In another embodiment, the temperature distribution is such that the temperature is at a maximum nearer the crystal growth region. The crystal growth region may include the region proximate to the growth face of a target crystal. Initially, the growth face may be the seed crystal surface, but as the target crystal grows, the growth face may translate outward from the original seed crystal surface. As the position of the temperature gradient region rises with respect to the seed or initial nucleus, additional source material dissolves in the flux near the upper portion of the gradient, and source material precipitates onto the growing crystal at the crystal growth region near the lower portion of the gradient.

Following growth, the crystal may be removed from the flux by dissolving the flux, for example, with at least one of water, a mineral acid, a mineral base, a molten salt, or an organic solvent, by mechanical means (fracture, cleavage, sawing, or the like), or combinations thereof.

The temperature distribution of the flux, crystal and crystal growth region may be maintained to provide a temperature distribution with a temperature gradient region, wherein the temperature is spatially varying within the crucible. The temperature distribution and gradient are such that the temperature of the crystal growth region is different from a temperature of the flux. The crystal growth region may be maintained within the temperature gradient region. If the solubility of the source material in the flux increases with temperature, the driving force for crystallization is the decreasing solubility of the source material in the flux with decreased temperature.

Crystal growth may be effected by moving the crucible with respect to the hot zone of the apparatus. Suitable movement rates may include a rate in a range of from about 0.1 mm/hour to about 0.5 mm/hr, from about 0.5 mm/hr to about 1 mm/hr, from about 1 mm/hr to about 5 mm/hr, or greater than about 5 mm/hr. Alternatively, the position of the crucible may be spatially fixed, and the heating elements may move relative to the crucible, to generate a moving, or movable, temperature distribution zone.

In one embodiment, neither the crucible nor the heating elements may move. However, the power level to one or more of the heating elements may be controlled, for example by a control unit, to generate a movable temperature distribution zone. In one embodiment, the power level may be controlled to increase and/or decrease, and in another embodiment, the power may be switched on/off to individual heating units or groups on heating units in an array. The temperature gradient region may move relative to the crucible while the spatial position of the crystal growth region changes relative to the crucible.

Growth rate may be increased by moving a temperature gradient zone relative to the crucible, or more particularly, relative to the contents of the crucible. Suitable processing pressures and temperatures may be greater than one atmosphere and about 500 degrees Celsius. The pressures and temperatures may be in a range of from about 1 atmosphere to about 80 kbar, and from about 500 degrees Celsius to about 3000 degrees Celsius, respectively. The solubility of the Group III metal nitrides in some fluxes may increase as a function of temperature. In this case, the end of reaction vessel 100 containing the source material may be maintained at a relatively higher temperature (T2 in FIGS. 1 and 2) during processing at high pressure/high temperature than the end of reaction vessel containing the seed crystal.

The solubility of the Group III metal nitrides in some other fluxes may decrease as a function of temperature. In such instances, the end of the reaction vessel containing the source material may be maintained at a relatively lower temperature (T2 in FIGS. 1 and 2) during processing at high pressure/high temperature than the end of the reaction vessel containing the seed crystal. The difference in temperature between source 102 (T2) and the seed crystal (T1 in FIGS. 1 and 2) may be in a range of from about 5 degrees Celsius to about 300 degrees Celsius. Under high pressure/high temperature conditions, the source material may dissolve in the flux, and may transport through the flux to the seed crystal. The seed crystal may be located at the low temperature end of reaction vessel to provide a nucleation site.

Because the Group III metal nitride solubility at an end of reaction vessel that contains the source material may differ relative to another end of the reaction vessel that contains the seed crystal, the concentration of dissolved Group III metal nitride may decrease in the direction from the source material toward the seed crystal. Because of the solubility difference, the Group III metal nitride, as it forms, may diffuse from the source material through the flux toward the seed crystal. At the seed crystal, the Group III metal nitride may precipitate onto the surface of the seed crystal to form a single crystal or quasi-single crystal of the Group III metal nitride. The single crystal or quasi-single crystal may be a boule or may be an ingot. Subsequently, the boule or the ingot may be processed further. Further processing may include one or more of wafering, dicing, or cutting.

A method of growing a single crystal or quasi-single crystal according to an embodiment of the invention may include disposing the flux and the source material in a volume. The volume may have a first region and a second region. A temperature in the first region may be controlled to be different from a temperature in the second region. The first region temperature may be sufficiently high to initiate crystal growth of the source material onto a surface of a seed crystal. A spatial location of the first region in the volume may be changed during crystal growth such that crystal growth propagates outward from the seed crystal surface toward the first region. Changing the spatial location may include one or more of: applying energy at differing intensities to varying locations within the volume; translating the volume relative to an energy source; translating the energy source relative to the volume; or rotating the energy source relative to the volume.

In one embodiment, a single crystal of a Group III metal nitride may be grown using a flux at moderate temperatures and pressures. The growth temperature may be in a range of from about 400 degrees Celsius to about 2500 degrees Celsius. For gallium nitride growth, the growth temperature is between about 600 degrees Celsius to about 1200 degrees Celsius, and the pressure may be in a range of from about 1 atmosphere to about 100 atmospheres, from about 100 atmospheres to about 500 atmospheres, from about 500 atmospheres to about 1000 atmospheres, from about 1000 atmospheres to about 1500 atmospheres, or from about 1500 atmospheres to about 2000 atmospheres.

For aluminum nitride growth, the growth temperature may be in a range of greater that about 1000 degrees Celsius. In one embodiment, the aluminum nitride growth temperature may be in a range of from about 1000 degrees Celsius to about 1500 degrees Celsius, from about 1500 degrees Celsius to about 2000 degrees Celsius, or from about 2000 degrees Celsius to about 2500 degrees Celsius; and, the pressure may be in a range of greater than about 0.001 atmospheres, from about 0.001 atmosphere to about 1 atmospheres, from about 1 atmosphere to about 25 atmospheres, from about 25 atmosphere to about 50 atmospheres, from about 50 atmosphere to about 100 atmospheres, or from about 100 atmosphere to about 200 atmospheres.

In one embodiment, the growth temperature of indium nitride may be in a range of from about 400 degrees Celsius to about 800 degrees Celsius, and the pressure may be in a range of from about 1 atmosphere to 2000 atmospheres. In other embodiments, the indium nitride growth temperature may be in a range of from about 400 degrees Celsius to about 500 degrees Celsius, from about 500 degrees Celsius to about 600 degrees Celsius, from about 600 degrees Celsius to about 700 degrees Celsius, or from about 700 degrees Celsius to about 800 degrees Celsius; and, the pressure may be in a range of greater than about 1 atmosphere, from about 1 atmosphere to about 100 atmospheres, from about 100 atmosphere to about 500 atmospheres, from about 500 atmosphere to about 1500 atmospheres, from about 1500 atmosphere to about 1750 atmospheres, or from about 1750 atmosphere to about 2000 atmospheres.

In one embodiment, for example in an apparatus as shown in FIG. 3, crystal growth may be initiated by heating the interior of the growth furnace by controlling the heating elements to provide thermal energy to the source material, and to melt the flux and allow the source material to dissolve in the flux and equilibrate. The seed crystal may be introduced into molten flux to initiate the crystal growth. The seed crystal may be withdrawn, optionally while rotating, to form newly-crystallized material on the surface of the seed crystal. Rotation of the crucible, either at a constant rotation speed or a varying rotation speed, may mix the flux. Such mixing may maintain supersaturation conditions over the entire crystal growth front of the crystal growth region.

After processing or growing the target crystal for a predetermined time, the reaction vessel may be cooled and the pressure on the reaction vessel may be released. The reaction vessel may be disassembled and the Group III metal nitride crystal may be removed, typically by washing the interior of the reaction vessel with mineral acids. Suitable mineral acids may include one or both of HCl or $HNO_3$.

Incorporation of impurities into the target may convey certain physical, chemical, and/or electrical properties to the grown crystals. Such properties may include one or more of ferro-magnetism or para-magnetism, electrical conductivity, electrical resistivity, light absorption, light emission, light scattering, or luminescence. The impurities may have, in some cases, a relatively insignificant effect on the electrical properties of the group III material. The impurities may be incorporated into the group III material either as atomically dispersed dopants, or as inclusions of aggregate impurity material.

With regard to impurities that may be atomically dispersed in the group III material, the impurities may be interstitial or substitutional. The target crystal so formed may be, for example, a AlInGaN single crystal and may include an impurity concentration of at least about 50 ppm or about 100 ppm by weight. The impurity may include at least one of F, Cl, Br, I, P, Rb, Cs, Mg, Ca, Sr, Ba, Sc, Ti, V, Cr, Mn, Fe, Co, Ni, Cu, Zn, Y, Zr, Nb, Mo, Pd, Ag, Hf, Ta, W, Pt, Au, Hg, Al, Ga, In, Tl, Ge, Sn, Sb, Pb, or Bi. Additionally or alternatively, the impurity may include at least one rare earth metal. In one embodiment, the rare earth metal may be selected from the Lanthanide series or from the Actinide series.

In differing embodiments, the impurity may include differing elements including one or more selected from Group IA, Group IIA, Groups IIIB to VIIB, Group VIII, Group IB, Group IIB, or Group VIIA of the periodic table of elements. The Group IA impurity may be one or both of Rb or Cs. The Group II impurity may be one or more of Mg, Ca, Sr, or Ba. The Groups IIIB to VIIB impurities may be one or more of Cr, Mo, Mn, Sc, W, or Y. The Groups IIIB to VIIB impurities may be one or more of Ti, Zr, or Hf. The Groups IIIB to VIIB impurities may be one or more of V, Ta, or Nb. The Group VIII impurity may be one or more of Co, Fe, Ir, Ni, Pd, Pt, or Rh. The Group IB impurity may be one or more of Cu, Ag, or Au. The Group IIB impurity may be one or more of Cd, Hg, or Zn. The Group VIIA impurity may be one or more of F, Cl, Br, or I. In one embodiment, the single crystal formed may be gallium nitride, and the impurity may include at least one of Fe, Mn, Zn, Pb, and Bi, as shown in Table IV.

With regard to the concentration of the impurity, the impurity concentration may be greater than about 0.01 weight percent. In one embodiment, the impurity concentration may be greater than about 1 weight percent. In one embodiment, the impurity concentration may be in a range of greater than about 100 ppm, in a range of from about 100 ppm by weight to about 1000 ppm, from about 1000 ppm to about 10,000 ppm, or greater than about 10,000 ppm by weight.

The grown crystal further may be cut or sliced into one or more wafers. The wafers may be processed such as lapped, mechanically polished, or chemically polished. Methods for slicing may include sawing with a wire saw or with an annular saw. Lapping and polishing may use a slurry containing particles of diamond, silicon carbide, silica, alumina, or ceria. Polishing may be followed by either chemical mechanical polishing or chemical mechanical planarization; or by etching. Etching may include dry etching, wet etching, and/or plasma etching. In one embodiment, the etching may include one or more of reactive ion etching (RIE), high-density inductively coupled plasma (ICP) plasma etching, electron cyclotron resonance (ECR) plasma etching, or chemically assisted ion beam etching (CAIBE).

Polished wafers may have an RMS surface roughness less than about 1 nanometer over a lateral area of at least 100 square micrometers. In one embodiment, the surface roughness may be less than about 0.5 nanometers over a lateral area of at least 100 square micrometers. Suitable wafers and/or substrates may have a thickness that is greater than about 0.01 millimeters. In on embodiment, the thickness may be in a range of from about 0.01 millimeters to about 0.05 millimeters, from about 0.05 millimeters to about 1 millimeters, from about 1 millimeters to about 2 millimeters, from about 2 millimeters to about 5 millimeters, or greater than about 5 millimeters.

The surface of the wafer may be flat, having a curvature of less than about 1 micron per millimeter. The front and back surfaces of the gallium nitride wafer may be parallel to better than 1 degree. In one embodiment, the crystallographic orientation of the front of the gallium nitride wafer is within about 10 degrees of one of the (0001) orientation, the (000 $\bar{1}$) orientation, the (1 $\bar{1}$ 00) orientation, the (11 $\bar{2}$ 0) orientation, and the (10 $\bar{1}$ 1) orientation. In another embodiment, the orientation of the front of the gallium nitride wafer may be within about 5 degrees of one of these orientations. At least one surface may be ground on the edge of the wafer to indicate the crystallographic orientation. The edge of the wafer may be chamfered or rounded in order to minimize the likelihood of chipping. In one embodiment, the wafer may be used for epitaxial growth of gallium nitride, aluminum gallium nitride, or an $Al_xIn_yGa_{1-x-y}N$ layer, where $0 \leq x \leq 1$ and $0 \leq y \leq 1$.

The crystal or wafer may be useful as a substrate for one or more of light emitting diodes, laser diodes, photodetectors, avalanche photodiodes, transistors, diodes, rectifiers, thyristors, Schottky rectifiers, p-i-n diodes, metal-semiconductor-metal diodes, high-electron mobility transistors, metal semiconductor field effect transistors, metal oxide field effect transistors, power metal oxide semiconductor field effect transistors, power metal insulator semiconductor field effect transistors, bipolar junction transistors, metal insulator field effect transistors, heterojunction bipolar transistors, power insulated gate bipolar transistors, power vertical junction field effect transistors, cascade switches, inner sub-band emitters, quantum well infrared photodetectors, quantum dot infrared photodetectors and other optoelectronic and electronic devices.

Generation of a moving hot zone and/or temperature gradient may allow the crystal growth front to propagate smoothly away from the surface of a seed crystal and/or the initial crystal nucleus. Embodiments of the present invention may allow for growth of high quality nitride crystals under milder conditions than other methods based on liquid gallium or supercritical ammonia, and at higher rates and larger sizes than other flux-based methods. It is noted that autoclaves may be suited to lower pressure applications than high-pressure, high-temperature (HPHT) equipment. Differing processing conditions may be required to account for differences in the equipment.

EXAMPLES

The following examples serve to illustrate the features and aspects offered by embodiments of the invention, and do not limit the invention thereto.

Example 1

Commercial grade gallium nitride powder, having a nominal purity of 99.9%, is mixed with lithium nitride ($Li_3N$) powder in a 6:1 ratio by weight. The mixed powders are pressed into a pill, wrapped in tantalum foil, and placed inside a magnesium oxide outer capsule reaction vessel. The encapsulated powders are placed in a cell and pressed at about 50 kbar to about 1500 degrees Celsius in a belt-type press apparatus for about 15 minutes. The reaction vessel is cooled and opened. The gallium nitride crystals are separated from the lithium nitride flux by washing with water and $HNO_3$. The gallium nitride crystals are approximately 20 microns in size. X-ray diffraction patterns obtained for the gallium nitride starting material and the gallium nitride crystals that are grown under high pressure/high temperature conditions are listed in Table 1.

TABLE 1

X-Ray diffraction patterns for GaN starting material and GaN crystals grown under high pressure/high temperature conditions.

| GaN Starting Material | | GaN Grown under high pressure/ high temperature | |
| --- | --- | --- | --- |
| d spacing (angstroms) | Peak Height Arbitrary units | d spacing (angstroms) | Peak Height Arbitrary units |
| — | — | 2.7551 | 1614 |
| 2.7571 | 491 | 2.5882 | 1310 |
| — | — | 2.4339 | 1505 |
| 2.4385 | 560 | 1.8872 | 427 |
| — | — | 1.5925 | 913 |
| — | — | 1.4633 | 609 |
| — | — | 1.3784 | 132 |
| — | — | 1.3566 | 376 |
| — | — | 1.3332 | 482 |
| — | — | 1.2953 | 117 |
| — | — | 1.2181 | 148 |
| — | — | 1.1719 | 69 |
| — | — | 1.0779 | 156 |
| — | — | 1.0432 | 121 |
| — | — | 1.0226 | 250 |

The x-ray diffraction pattern for the gallium nitride crystals grown under high pressure/high temperature conditions include diffraction peaks not observable in the starting material. The pattern shows relatively larger peak heights than the x-ray diffraction pattern obtainable for the gallium nitride starting material. The difference indicates that the gallium nitride crystals grown under high pressure/high temperature conditions have a higher degree of crystallinity than the gallium nitride starting material.

Example 2

Commercially available gallium nitride powder, having the same nominal purity and relatively poor crystallinity as described in Example 1, is compacted into a pill weighing about 1.4 g. Ammonium iodide ($NH_4I$) powder is compacted into a second pill weighing 2.6 g. The two pills are placed into a reaction vessel. The reaction vessel may include two opposing cups fabricated from hot-pressed boron nitride. The reaction vessel is then placed within a cell and treated at high pressure and high temperature in a temperature gradient cell in a belt-type press apparatus. The pressure is approximately 30 kbar. The temperature of the top of the cell is about 1435 degrees Celsius, and the temperature at the bottom of the cell is about 1360 degrees Celsius. After a treatment time of about 20 hours, the cell is cooled and removed from the press. Residual $NH_4I$ is washed out of the cell with water, leaving residual gallium nitride powder and well-crystallized gallium nitride crystals having an average diameter of about 0.5 mm. X-ray diffraction studies confirm that the crystals are gallium nitride.

Example 3

Gallium nitride powder is compacted into a pill weighing about 1.25 g. A second pill is compacted from a mixture may include about 2.6 g of ammonium iodide ($NH_4I$) powder to about 0.1 grams of gallium nitride powder. The two pills are placed into a reaction vessel that includes two opposing cups fabricated from hot-pressed boron nitride. The reaction vessel is placed within a cell and treated at high pressure and high temperature in a belt-type press apparatus, and in which a temperature gradient zone is created and relative to the crucible. At one point during the procedure, the pressure is approximately 40 kbar and the temperature of the top of the cell is about 1450 degrees Celsius, while the temperature at the bottom of the cell is about 1375 degrees Celsius. After a treatment time of 24 hours, the cell is cooled and removed from the press. Residual $NH_4I$ is washed out of the cell with water, leaving residual gallium nitride powder and well-crystallized gallium nitride crystals.

Example 4

Gallium nitride powder is compacted into a pill weighing about 1.25 g. A second pill is compacted from a mixture may include about 2.4 grams of ammonium bromide ($NH_4Br$) powder to about 0.1 grams of gallium nitride powder. The two pills are placed into a reaction vessel formed from two opposing cups fabricated from hot-pressed boron nitride. The reaction vessel is placed within a cell and treated at high pressure and high temperature in a belt-type press apparatus, and in which a temperature gradient zone is created and relative to the crucible. The pressure is approximately 40 kbar. At least at one point during the procedure, the temperature of the top of the cell is about 1330 degrees Celsius, and the temperature at the bottom of the cell is about 1255 degrees Celsius. After a treatment time of about 16 hr, the cell is cooled and removed from the press. Residual $NH_4Br$ is washed out of the cell with water, leaving residual gallium nitride powder and gallium nitride crystals.

Example 5

Gallium nitride powder is compacted into a pill weighing about 1.25 g. A second pill is compacted from a mixture may include about 2.6 g of ammonium iodide ($NH_4I$) powder to about 0.1 grams of gallium nitride powder. A single crystal of silicon carbide, 1 millimeters×1 millimeters×0.2 millimeters, serves as a seed. The two pills are separated by a tungsten baffle and placed into the reaction vessel, which may include two opposing cups fabricated from hot-pressed boron nitride. The reaction vessel is placed within a cell and treated at high pressure and high temperature in a belt-type press apparatus, and in which a temperature gradient zone is created and relative to the crucible. The pressure is approximately 40 kbar. For at least a portion of the time during processing, the temperature of the top of the cell is about 1450 degrees Celsius, and the temperature at the bottom of the cell is about 1375 degrees Celsius. After a treatment time of 30 hr, the cell is cooled and removed from the press. Residual $NH_4I$ is washed out of the cell with water, leaving residual gallium nitride powder and 200 micrometer diameter, well-crystallized gallium nitride crystals.

Example 6

A mixture of gallium and manganese in a predetermined ratio is placed in a silica crucible and the crucible inserted into a silica reactor tube. This assembly is heated to 1050 degrees Celsius for 2 hours, under flowing nitrogen. A flux that includes a gallium-manganese alloy is formed having an amount of nitrogen dissolved therein. The ratio of ingredients in the alloy is measured by the weight gain after the test. Some results are summarized in the Table II.

TABLE II

| | Test conditions and results | | |
|---|---|---|---|
| Test conditions | 50% Mn, 1050° C. | 50% Mn, 1000° C. | 30% Mn, 1000° C. |
| Weight gain | 0.4 wt % N | 0.2 wt % N | Below detection limit |

Example 7

A piece of polycrystalline gallium nitride material is placed in a flux containing gallium and manganese at high temperature for several hours (see table III) in flowing nitrogen. Gallium nitride is soluble under these conditions in the flux and some weight loss of the poly-GaN is recorded after the test. Results are summarized in the Table III.

TABLE III

| | Test conditions and results | |
|---|---|---|
| Temp, ° C. | Time, hours | Weight change in poly-GaN |
| 1000 | 2 | −80% |
| 950 | 2 | −10% |

Example 8

Approximately 5 grams of 30 weight percent iron-70 weight percent gallium flux is heated to 1000 degrees Celsius for 2 hours in 8 percent ammonia-9 percent hydrogen-argon (balanced) gas. The gallium in the flux reacts with nitrogen in ammonia to form gallium nitride crystals. After the test, 1.299 grams of synthesized gallium nitride is extracted from the flux with aqua regia.

Trace elements in synthesized gallium nitride crystals are determined by X-ray fluorescence analysis. Results show the incorporation of dopant or inclusion materials in gallium nitride crystals. The following Table IV shows some examples of dopants and/or inclusions detected in gallium nitride synthesized in various flux systems.

TABLE IV

Dopants and inclusions.

| Wt % | Fe—Ga flux | Mn—Ga flux | Zn—Ga flux | Pb—Ga flux | Bi—Ga flux |
|---|---|---|---|---|---|
| Fe | 0.05 | <0.01 | <0.01 | <0.01 | <0.01 |
| Mn | <0.01 | 0.4 | <0.01 | <0.01 | <0.01 |
| Zn | <0.01 | <0.01 | 0.9 | <0.01 | <0.01 |
| Pb | <0.01 | <0.01 | <0.01 | >1 | <0.01 |
| Bi | <0.01 | <0.01 | <0.01 | <0.01 | 0.2 |

Unless otherwise specified, tests are at ambient pressure with nitrogen, ammonia or dilute ammonia. The temperature range is in a range of from about 500 degrees Celsius to about 1100 degrees Celsius. Gas may be introduced at a moderate flow rate, either over a static bath or may be injected via a lance to bubble up through the flux. Containment materials include silica crucibles, cold-pressed gallium nitride crucibles, glassy carbon, pressed boron nitride, and graphite crucibles. Samples are evaluated using techniques including weight change measurements, X-ray diffraction, X-ray fluorescence, optical metallography, scanning electron microscopy, and energy dispersive analysis.

The embodiments described herein are examples of compositions, structures, systems and methods having elements corresponding to the elements of the invention recited in the claims. This written description may enable one of ordinary skill in the art to make and use embodiments having alternative elements that likewise correspond to the elements of the invention recited in the claims. The scope thus includes compositions, structures, systems and methods that do not differ from the literal language of the claims, and further includes other compositions, structures, systems and methods with insubstantial differences from the literal language of the claims. While only certain features and embodiments have been illustrated and described herein, many modifications and changes may occur to one of ordinary skill in the relevant art. The appended claims are intended to cover all such modifications and changes.

The invention claimed is:

1. An apparatus, comprising:
a stationary crucible operable to be sealed to a nitrogen-containing gas, the crucible being chemically inert to at least ammonia at a temperature in a range of about 400 degrees Celsius to about 2500 degrees Celsius, and the crucible having an inner surface defining at least a first volume and a second volume;
an energy source operable to supply thermal energy to the crucible; and
a controller operable to control the energy source to selectively direct sufficient thermal energy to the first volume within the crucible to attain a first temperature in a range of from about 400 degrees Celsius to about 2500 degrees Celsius, wherein the thermal energy is sufficient to initiate, sustain, or both initiate and sustain growth of a crystal in the first volume, and
the first temperature in the first volume being controllable separately from a second temperature in the second volume.

2. The apparatus as defined in claim 1, wherein controller is further operable to form a temperature gradient extending from the first volume to the second volume, and to define a temperature gradient zone.

3. The apparatus as defined in claim 2, wherein crystal growth occurs in the first volume and within the temperature gradient zone.

4. The apparatus as defined in claim 1, wherein the energy source comprises a plurality of heating elements disposed in an array relative to the crucible.

5. The apparatus as defined in claim 4, wherein the controller is operable to direct a supply of thermal energy to the crucible by increasing power or decreasing power to at least one predefined heating element of the plurality of heating elements such that the first volume is translated relative to the crucible in response to, or in anticipation of, crystal growth in the first volume.

6. The apparatus as defined in claim 1, wherein the controller is further operable to control the energy source to supply thermal energy at differing intensities to differing locations within the crucible.

7. The apparatus as defined in claim 1, further comprising a motor communicating with the energy source or a support structure.

8. The apparatus as defined in claim 7, wherein the controller can operate the motor to translate the energy source relative to the crucible, and further to translate the first volume relative to the crucible.

9. The apparatus as defined in claim 7, wherein the controller can operate the motor to translate the crucible relative to the energy source.

10. The apparatus as defined in claim 1, wherein the crucible comprises an inlet configured to inflow nitrogen-containing gas.

11. The apparatus as defined in claim 10, further comprising a nitrogen-containing gas source communicating with an interior of the crucible through the inlet.

12. The apparatus as defined in claim 11, wherein the nitrogen-containing gas source is an ammonia gas source.

13. The apparatus as defined in claim 10, wherein the inlet is further configured to inflow nitrogen-containing gas at elevated pressures during crystal growth.

14. The apparatus as defined in claim 1, wherein the crystal comprises a Group III metal.

15. The apparatus as defined in claim 1, wherein the crystal comprises a nitride.

16. The apparatus as defined in claim 1, further comprising a source material, a flux material, or a source material and a flux material disposed within the crucible.

17. The apparatus as defined in claim 16, wherein the source material has an oxygen or oxidant content of less than about 100 ppm.

18. The apparatus as defined in claim 17, wherein the source material has an oxygen or oxidant content of less than about 10 ppm.

19. The apparatus as defined in claim 16, wherein the solubility of the source material in the flux material increases in response to an increase in temperature, and the temperature differential across the temperature gradient zone is within a range of temperature that is greater than about 1 degree Celsius.

20. The apparatus as defined in claim 16, further comprising a source material and a flux material disposed within the crucible, wherein the solubility of the source material in the flux material decreases in response to an increase in temperature, and the temperature differential across the temperature gradient zone is within a range of greater than about 1 degree Celsius.

21. The apparatus as defined in claim 16, further comprising one or more seed crystals disposed within the crucible.

22. The apparatus as defined in claim 21, wherein the temperature gradient zone in which crystal growth occurs extends from a surface of at least one of the seed crystals.

23. The apparatus as defined in claim 22, wherein the temperature gradient zone extends at least from the seed crystal surface outward by a distance of up to about 10 micrometers.

24. The apparatus as defined in claim 23, wherein the controller is operable to define the crystal growth zone and to control the energy source to at least achieve a temperature within the crystal growth zone sufficient to produce the crystal growth at a rate of greater than 0.2 millimeters per day.

25. The apparatus as defined in claim 23, wherein the source material comprises indium, and the temperature in the first volume is maintainable in a range of from about 400 degrees Celsius to about 800 degrees Celsius.

26. The apparatus as defined in claim 1, wherein the crystal has an oxygen or oxidant content of less than about 100 ppm.

27. The apparatus as defined in claim 26, wherein the crystal has an oxygen or oxidant content of less than about 10 ppm.

28. The apparatus as defined in claim 1, further comprising a nitrogen-containing gas source communicating with at least the first volume.

29. The apparatus as defined in claim 28, wherein the nitrogen-containing gas comprises one or both of ammonia or diatomic nitrogen.

30. The apparatus as defined in claim 1, wherein the source material comprises gallium, and the temperature in the first volume is in a range of from about 600 degrees Celsius to about 1200 degrees Celsius.

31. The apparatus as defined in claim 1, wherein the source material comprises aluminum, and the temperature in the first volume is in a range of from about 1000 degrees Celsius to about 2500 degrees Celsius.

32. The apparatus as defined in claim 1, wherein the crucible is configured to maintain pressure inside the crucible at a desired pressure level at a selected temperature.

33. A crystal growth apparatus, comprising:
means for defining a volume, the volume having a first region and a second region, and the volume being operable to contain a flux material, a source material, and a seed crystal, wherein the seed crystal has a surface within the first region;
means for controlling a temperature in the first region to be different than the temperature in the second region and for increasing the first region temperature to be sufficient to initiate crystal growth of the source material at the seed crystal surface, wherein the first and second regions are within the volume;
means for changing a spatial location of the first region relative to the volume during crystal growth; and
means for sealing the volume.

* * * * *